(12) United States Patent
Cho et al.

(10) Patent No.: US 7,763,402 B2
(45) Date of Patent: Jul. 27, 2010

(54) PHOTOSENSITIVE RESIN COMPOSITION

(75) Inventors: Hyun-il Cho, Gyeonggi-Do (KR);
Taeg-sung Jung, Gyeonggi-Do (KR);
Hee-jung Jung, Gyeongi-Do (KR);
Chan-seok Park, Gyeonggi-Do (KR)

(73) Assignee: Dongjin Semichem Co., Ltd. (KR)

( * ) Notice: Subject to any disclaimer, the term of this patent is extended or adjusted under 35 U.S.C. 154(b) by 336 days.

(21) Appl. No.: 11/844,886

(22) Filed: Aug. 24, 2007

(65) Prior Publication Data

US 2008/0051483 A1 Feb. 28, 2008

(30) Foreign Application Priority Data

Aug. 25, 2006 (KR) .................. 10-2006-0081016

(51) Int. Cl.
*G02B 5/20* (2006.01)
*G03C 1/00* (2006.01)
(52) U.S. Cl. .................. 430/7; 430/287.1; 522/75; 522/121
(58) Field of Classification Search .............. 430/7, 430/20, 281.1, 287.1; 522/75, 121
See application file for complete search history.

(56) References Cited

U.S. PATENT DOCUMENTS

| 5,750,292 | A  | * | 5/1998  | Sato et al. ...................... 430/15 |
| 5,858,633 | A  | * | 1/1999  | Chen et al. ................... 430/512 |
| 6,191,184 | B1 | * | 2/2001  | Suzuki et al. ................. 522/79 |
| 6,558,858 | B2 | * | 5/2003  | Ueda et al. ...................... 430/7 |
| 6,746,820 | B2 | * | 6/2004  | Furukawa ................ 430/281.1 |
| 7,041,416 | B2 | * | 5/2006  | Wakata et al. .................. 430/5 |
| 7,247,659 | B2 | * | 7/2007  | Kura et al. ..................... 522/12 |
| 2004/0096757 | A1 | * | 5/2004 | Tokuda et al. .................. 430/8 |

FOREIGN PATENT DOCUMENTS

KR 1020060063475 12/2006

\* cited by examiner

*Primary Examiner*—Susan W Berman
(74) *Attorney, Agent, or Firm*—Cantor Colburn LLP

(57) ABSTRACT

The present invention relates to a photosensitive resin composition, and more particularly, to a photosensitive resin composition for forming an over coating layer of a color filter. The photosensitive resin composition according to the present invention includes a UV absorber. The photosensitive resin composition according to the present invention adjusts line width and height of a pattern without difficulty, forms a linear pattern, provides good transmittance and is adequate to form the over coating layer of the color filter.

9 Claims, 5 Drawing Sheets

PHOTOSENSITIVE RESIN COMPOSITION

CROSS-REFERENCE TO RELATED APPLICATIONS

This application claims priority from Korean Patent Application No. 2006-0081016, filed on Aug. 25, 2006, in the Korean Intellectual Property Office, the disclosure of which is incorporated herein by reference.

BACKGROUND OF THE INVENTION

1. Field of the Invention

The present invention relates to a photosensitive resin composition, and more particularly, to a photosensitive resin composition which adjusts line width and height of a pattern without difficulty, forms a linear pattern, provides good transmittance and is adequate to form an over coating layer (OCL) of a color filter.

2. Description of the Related Art

Figure 1:
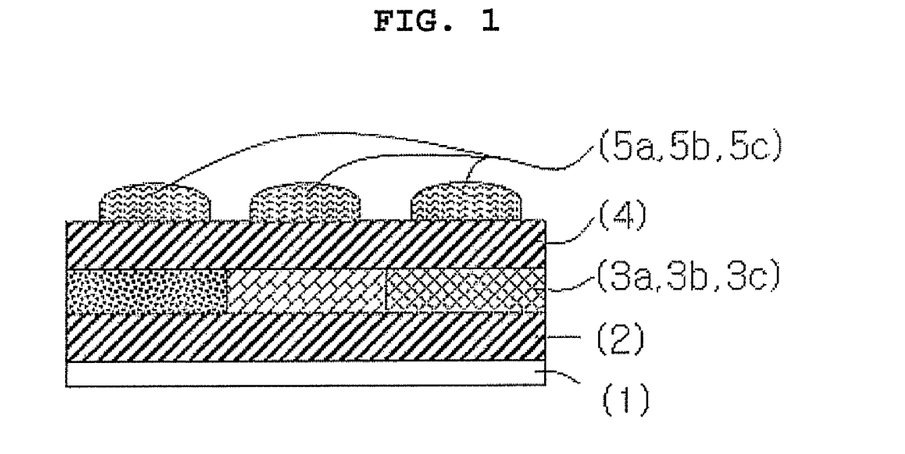
FIG. 1 is a sectional view of a conventional color filter array.
Figure 2:
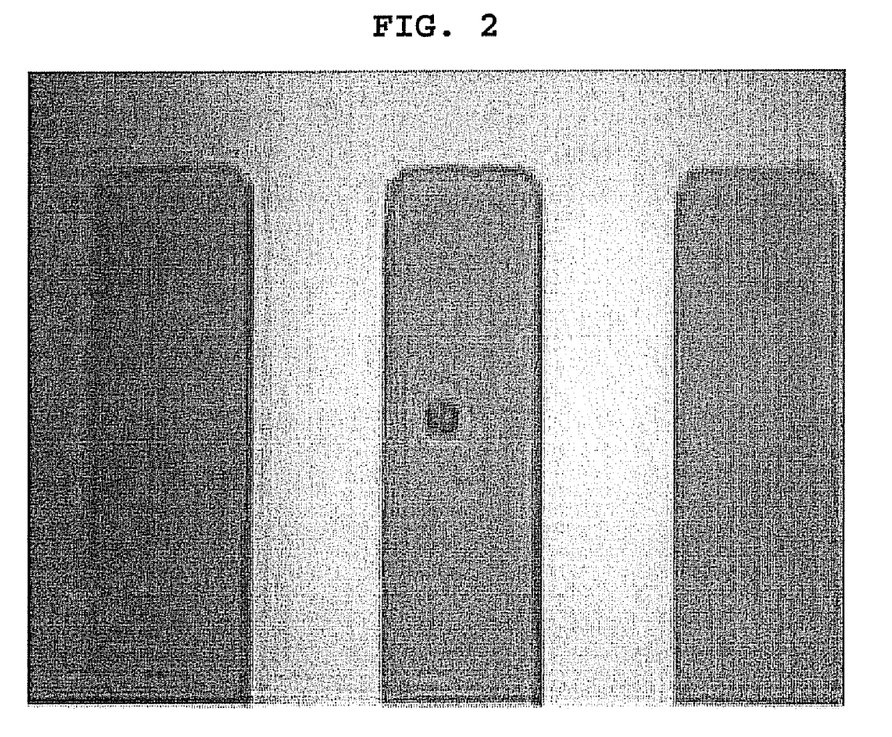
FIG. 2 illustrates a pattern profile which uses a photosensitive resin composition according to an exemplary embodiment of the present invention.
Figure 3:
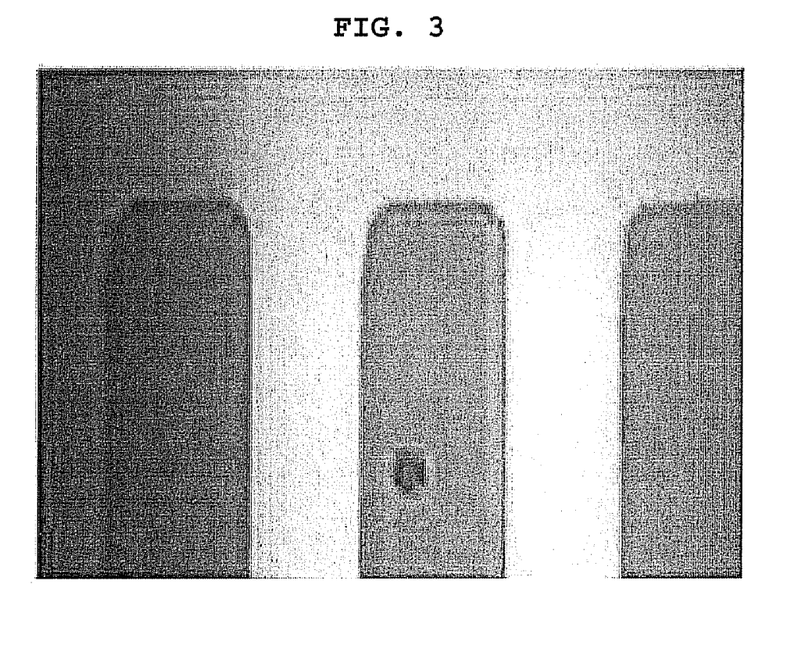
FIG. 3 illustrates a pattern profile which uses a photosensitive resin composition according to another exemplary embodiment of the present invention.
Figure 4:
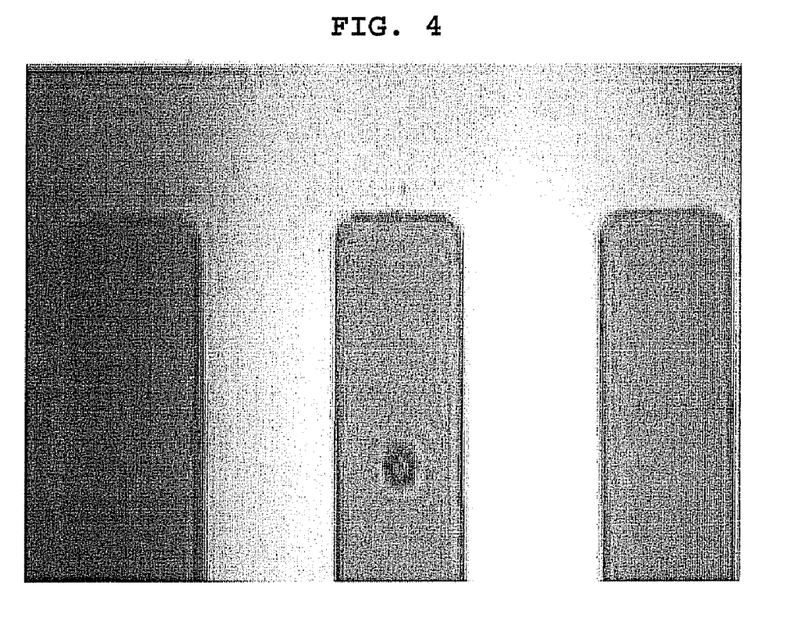
FIG. 4 illustrates a pattern profile which uses a photosensitive resin composition according to another exemplary embodiment of the present invention.
Figure 5:
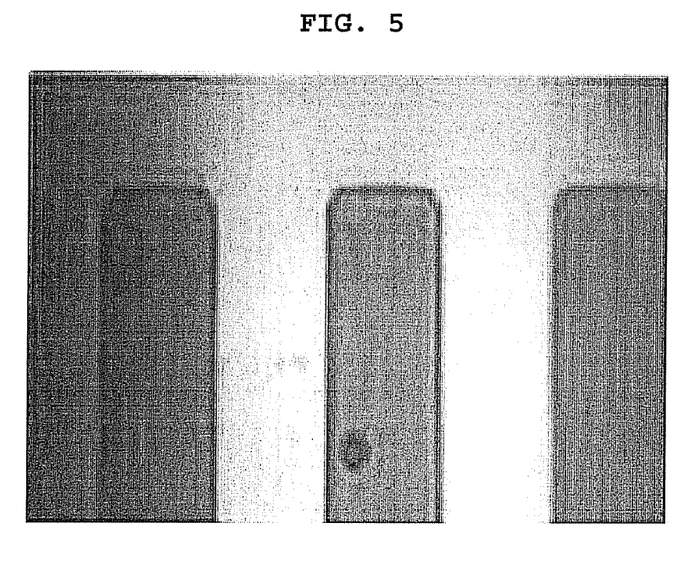
FIG. 5 illustrates a pattern profile which uses a photosensitive resin composition according to another exemplary embodiment of the present invention.
Figure 6:
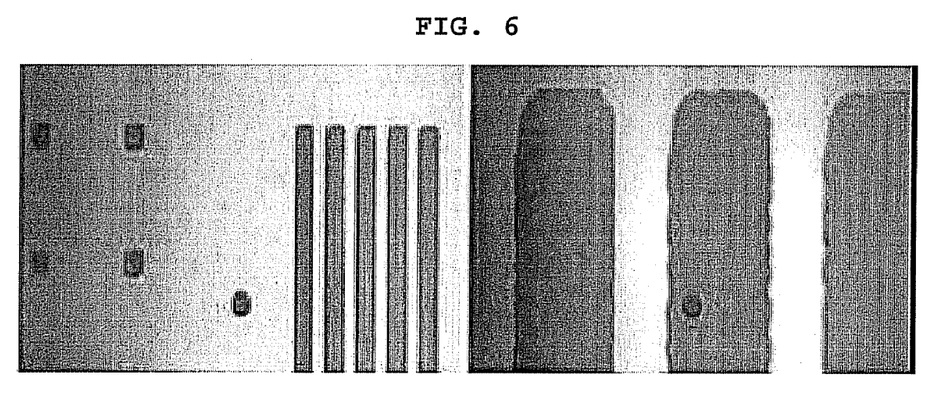
FIG. 6 illustrates a pattern profile which uses a photosensitive resin composition according to a comparative embodiment of the present invention.
Figure 7:
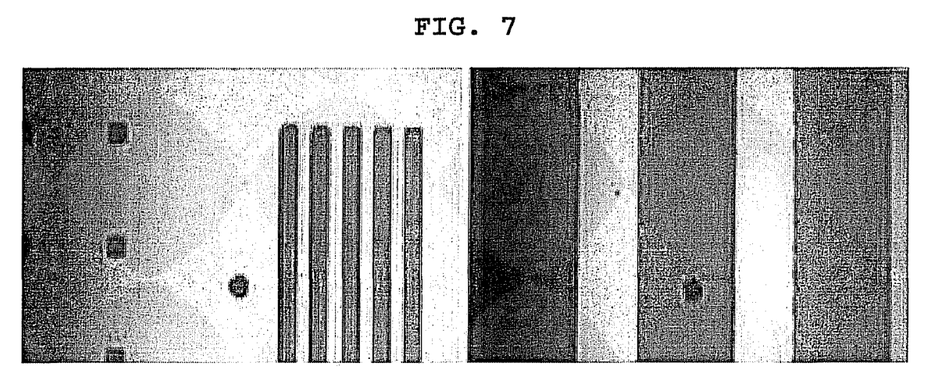
FIG. 7 illustrates a pattern profile which uses a photosensitive resin composition according to another comparative embodiment of the present invention.
Figure 8:
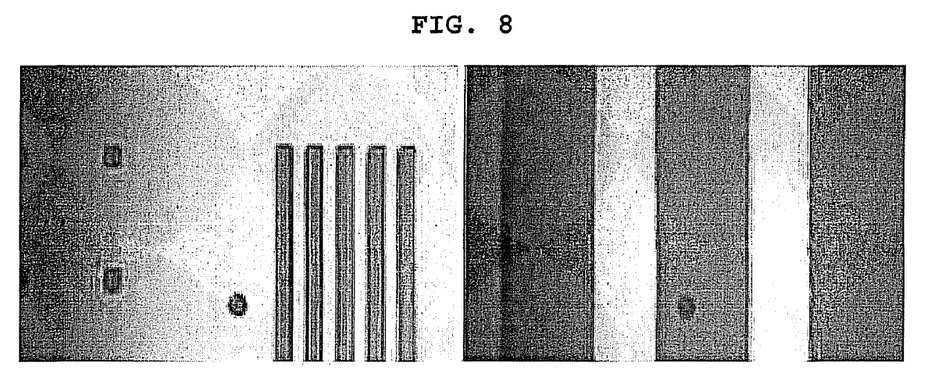
FIG. 8 illustrates a pattern profile which uses a photosensitive resin composition according to another comparative embodiment of the present invention.

FIG. 1 is a sectional view of a conventional color filter array of a semiconductor device. Main parts of a conventional CMOS image sensor for collecting light are illustrated in FIG. 1.

As shown therein, a first over coating layer 2 is formed on a semiconductor substrate 1 which has finished shallow trench isolation and a passivation process. Color filter arrays 3a, 3b and 3c are formed on the first over coating layer 2. A second over coating layer 4 is formed on the color filter arrays 3a, 3b and 3c to provide a planar surface and protect a device. Micro lenses 5 are formed corresponding to the respective color filter arrays 3a, 3b and 3c.

The red, green and blue color filters 3a, 3b and 3c include photoresist (Korean Patent First Publication No. 2006-0063475) which is pigment-dispersed to absorb light at particular wavelengths. Polymer resin is commonly used as the material of the micro lenses 5.

If the color filters 3a, 3b and 3c are formed in a size of 3.2 um and below with the foregoing method, boundaries between the color filters 3a, 3b and 3b become unclear, thereby lowering uniformity in the size and height of the pattern. As the color filters 3a, 3b and 3c have different sizes, light may be incident to wrong optical paths. Then, light may not be sensed or interference phenomena occur in neighboring color filters 3a, 3b and 3c, thereby hardly realizing a high quality image from a CMOS image sensor.

SUMMARY OF THE INVENTION

Accordingly, it is an aspect of the present invention to provide a photosensitive resin composition which adjusts line width and height of a pattern without difficulty, forms a linear pattern, provides good transmittance and is adequate to form an over coating layer of a color filter.

Also, it is another aspect of the present invention to provide a color filter which includes the photosensitive resin composition, and a manufacturing method thereof.

Further, it is another aspect of the present invention to provide a CMOS image sensor which includes the color filter.

Additional aspects and/or advantages of the present invention will be set forth in part in the description which follows and, in part, will be obvious from the description, or may be learned by practice of the present invention.

The foregoing and/or other aspects of the present invention are also achieved by providing a photosensitive resin composition which is used to form an over coating layer (OCL) of a color filter, the photosensitive resin composition comprising a UV absorber.

The foregoing and/or other aspects of the present invention are also achieved by providing a color filter forming method which uses the photosensitive resin composition.

The foregoing and/or other aspects of the present invention are also achieved by providing a color filter which includes the photosensitive resin composition.

The foregoing and/or other aspects of the present invention are also achieved by providing a CMOS image sensor which employs the color filter.

BRIEF DESCRIPTION OF THE DRAWINGS

The above and/or other aspects of the present invention will become apparent and more readily appreciated from the following description of the embodiments, taken in conjunction with the accompanying drawings of which.

DETAILED DESCRIPTION OF EXEMPLARY EMBODIMENT

Hereinafter, exemplary embodiments of the present invention will be described with reference to accompanying drawings, wherein like numerals refer to like elements and repetitive descriptions will be avoided as necessary.

A photosensitive resin composition according to the present invention includes a UV absorber. Other than the UV absorber, the photosensitive resin composition may further include typical materials such as resin, cross-linkable monomer, a photopolymerization initiator and a solvent.

The UV absorber which is used in the present invention inhibits polymerization in a non-patterned part having diffused reflection due to wavelengths of ultraviolet rays in an exposing process.

The UV absorber may include benzotriazole, benzophenone, triazine derivative, oxalic anilide, pyrimidine, salicylic acid derivative, etc. Preferably, the UV absorber includes a compound which is represented by following chemical formulas 1, 2, 3 and 4.

[Chemical Formula 1]

[Chemical Formula 2]

[Chemical Formula 3]

[Chemical Formula 4]

In the chemical formulas 1 to 4, each of $R_1$ to $R_5$ is hydrogen or $CH_3$.

Preferably, 0.1 wt % to 5 wt % UV absorber is included in the photosensitive resin composition according to the present invention. More preferably, 1 wt % to 2 wt % UV absorber is included in the photosensitive resin composition according to the present invention. If the content of the UV absorber is lower than 0.1 wt %, the line width of an upper color filter increases. Meanwhile, if the content of the UV absorber is higher than 5 wt %, curing of resin becomes lowered and an image is not normally realized due to low sensitivity. Also, it is inadequate to form a linear pattern.

Preferably, the photosensitive resin composition according to the present invention includes as follows:
 a) 5 wt % to 50 wt % resin;
 b) 5 wt % to 30 wt % cross-linkable monomer;
 c) 0.5 wt % to 5 wt % photopolymerization initiator;
 d) 0.1 wt % to 5 wt % UV absorber; and
 e) the remaining portion of solvent.

More preferably, the photosensitive resin composition according to the present invention includes as follows:
 a)i) 5 wt % to 50 wt % alkali soluble acrylate resin having a glass transition temperature of 150° C. and below or ii) 5 wt % to 50 wt % photopolymer resin;
 b) 5 wt % to 30% cross-linkable monomer having at least two ethylene double bonds;
 c) 0.5 wt % to 5 wt % photopolymerization initiator;
 d) 0.1 wt % to 5 wt % UV absorber; and
 e) the remaining portion of solvent.

Preferably, the acrylate resin has a low glass transition point, and has a glass transition temperature of 150° C. and below to make a photosensitive resin composition more flexible.

The acrylate polymer resin which has the low glass transition point may be manufactured by polymerizing unsaturated carboxylic acid, aromatic monomer, a monomer to make a surface flexible, and acrylic monomer.

The unsaturated carboxylic acid is used to be alkali-soluble, and may specifically include acrylic acid, methacrylic acid, itaconic acid, maleic acid, fumaric acid, vinyl acetate or acid anhydride thereof.

Preferably, 20 wt % to 50 wt % unsaturated carboxylic acid is included in the acrylate polymer resin having the low glass transition point. If the content of the unsaturated carboxylic acid ranges as described above, developing time may not be prolonged. Also, it is not difficult for gelation and to adjust the degree of polymerization, and prevents storage stability of the photosensitive resin composition from being deteriorated.

The aromatic monomer improves chemical resistance and heat resistance of the final photosensitive resin composition.

The aromatic monomer may include styrene, benzyl methacrylate, benzyl acrylate, phenyl acrylate, phenyl methacrylate, 2-nitrophenylacrylate, 4-nitrophenylacrylate, 2-nitrophenylmethacrylate, 4-nitrophenylmethacrylate, 2-nitrobenzylmethacrylate, 4-nitrobenzylmethacrylate, 2-chlorophenylacrylate, 4-chlorophenylacrylate, 2-chlorophenylmethacrylate or 4-chlorophenylmethacrylate.

Preferably, 15 wt % to 45 wt % aromatic monomer is included in the acrylate polymer resin having the low glass transition point. If the content of the aromatic monomer ranges as described above, a pattern may not be damaged due to low adhesiveness to a substrate. Also, the pattern is formed linearly, thereby securing the stable pattern. Further, it prevents flexibility of a dry film from being lowered, and prevents durability with respect to a plastic substrate from being deteriorated.

The monomer lowers the glass transition point of the acrylate polymer resin, enhances flexibility of the polymer and improves durability to plastic.

The monomer makes the surface flexible, and may include metha acrylicester, isotridecyl methaacrylate, steryl methaacrylate, isodecyl methaacrylate, ethylhexyl methaacrylate, ethyltriglycol methaacrylate, methoxy polyethyleneglycol methaacrylate, or butyl diglycol methaacrylate of ethoxylated fatty alcohol.

Preferably, the monomer which makes the surface flexible is included from 3 wt % to 15 wt % in the acrylate polymer resin having the low glass transition point. If the content of the monomer ranges as described above, the acrylate polymer resin is not easily damaged due to higher glass transition point, and the flexibility of the photosensitive resin composition may be not be deteriorated. Also, a pattern may not be damaged during a developing process, and may be formed linearly.

The acrylic monomer adjusts the polarity of the acrylate polymer resin having the low glass transition point. Specifically, the acrylic monomer may include 2-hydroxyethyl (metha)acrylate, 2-hydroxyoctyl(metha)acrylate, methyl (metha)acrylate, ethyl(metha)acrylate, or n-butylacrylate.

Preferably, 10 wt % to 30 wt % acrylic monomer is included in the acrylate polymer resin having the low glass transition point. If the content of the acrylic monomer ranges as described above, heat resistance, dispersibility and a hydrophilic property of the acrylate polymer resin to a developer may improve.

As described above, the unsaturated carboxylic acid, aromatic monomer, the monomer to make the surface flexible, and the acrylic monomer are polymerized in a solvent having the proper polarity to prevent gelation, thereby manufacturing the final acrylate polymer resin having the low glass transition point.

Preferably, the acrylate polymer resin having the low glass transition point has a weight average molecular weight ranging from 10,000 to 35,000, and more preferably 15,000 to 25,000. If the weight average molecular weight of the acrylate polymer resin ranges as described above, a development margin improves, developing time is not prolonged, and a residual layer is not formed.

The acrylate polymer resin has the glass transition temperature of 150° C. and below, and is preferably included from 5 wt % to 30 wt % in the photosensitive resin composition according to the present invention. More preferably, 15 wt % to 25 wt % acrylate polymer resin is included in the photosensitive resin composition according to the present invention. If the content of the acrylate polymer resin ranges as described above, flexibility improves and a stability-related problem such as a cold flow does not occur.

The photo polymer resin in a) ii) according to the present invention improves the sensitivity of the photosensitive resin composition.

The photo polymer resin is dissolved in aqueous alkaline solution, and preferably includes a compound which is represented by a following chemical formula 5 or 6.

[Chemical Formula 5]

[Chemical Formula 6]

In the chemical formula 5 or 6, each $R_1$ refers to an alkyl group having 1 to 2 hydrogen atoms or carbon atoms, $R_2$ is an alkyl group having 2 to 5 carbon atoms that is substituted with a hydroxyl group or not, and $a+b+c=1$, $0.1<a<0.4$, $0<b<0.5$ and $0.1<c<0.5$.

The photo polymer resin preferably has a weight average molecular weight ranging from 10,000 to 80,000, and more preferably 15,000 to 50,000. If the weight average molecular weight of the photo polymer resin ranges as described above, the developing time may not be prolonged, and the residual layer may be removed without difficulty.

Preferably, 5 wt % to 30 wt % photo polymer resin is included in the photosensitive resin composition according to the present invention. If the content of the photo polymer resin ranges as described above, the photosensitive resin composition having proper viscosity may be formed to adjust thickness without difficulty.

The alkali soluble acrylate resin having the glass transition temperature of 150° C. and below or the photo polymer resin may be used alone or mixed with other materials to form the photosensitive resin composition according to the present invention. Preferably, 5 wt % to 50 wt % alkali soluble acrylate resin or 5 wt % to 50 wt % photo polymer resin may be included in the photosensitive resin composition to provide proper viscosity in the process and to adjust thickness thereof without difficulty.

The cross-linkable monomer in b) has at least two ethylene double bonds. The cross-linkable monomer may include 1,4-butanedioldiacrylate, 1,3-butyleneglycoldiacrylate, ethyleneglycoldiacrylate, pentaerythritoltetraacrylate, triethyleneglycoldiarcrylate, polyethyleneglycoldiacrylate, dipentaerythritoldiarcrylate, sorbitoltriacrylate, bisphenol A diacrylate derivative, trimethylpropanetriacrylate, dipentaerythritolpolyacrylate, and methacrylate thereof.

The cross-linkable monomer has at least two ethylene double bonds, and preferably is included from 5 wt % to 30 wt % in the photosensitive resin composition according to the present invention. If the content of the cross-linkable monomer ranges as described above, the photosensitive resin composition becomes softer, and developability and adhesiveness thereof improve.

The photopolymerization initiator in c) initiates polymerization of the cross-linkable monomer by wavelengths of visible rays, ultraviolet rays, etc.

The photopolymerization initiator may include a triazine compound, a benzoin compound, an acetophenone compound, a xanthone compound or an imidazole compound. More specifically, the photopolymerization initiator may include a triazine compound such as 2,4-bistrichloromethyl-6-p-methoxystyryl-s-triazine, 2-p-methoxystyryl-4,6-bis-trichloromethyl-s-triazine, 2,4-trichloromethyl-6-triazine and 2,4-trichloromethyl-4-methylnaphthyl-6-triazine; a benzoin compound such as benzophenone and p-(diethylamino)benzophenone; an acetophenone compound such as 2,2-dichloro-4-phenoxyacetophenone, 2,2-diethoxyacetophenone, 2,2-dibutoxiacetophenone, 2-hydroxy-2-methylpropiophenone, p-t-butyltrichloroacetophenone; a xanthone compound such as xanthone, thioxanthone, 2-methylthioxanthone, 2-isobutylthioxanthone, 2-dodecylthioxanthone, 2,4-dimethylthioxanthone, 2,4-diethylthioxanthone or an imidazole compound such as 2,2-bis-2-chlorophenyl-4,5,4,5-tetraphenyl-2-1,2-bisimidazole and 2,2-bis(2,4,6-tricyanophenyl)-4,4,5,5-tetraphenyl-1,2-bisimidazole.

Preferably 0.5 wt % to 5 wt %, and more preferably 1 wt % to 2 wt % photopolymerization initiator is included in the photosensitive resin composition according to the present invention. If the content of the photopolymerization initiator ranges as described above, curing and sensitivity of the photosensitive resin composition improve, thereby forming a normal and liner pattern, enhancing storage stability and resolution and preventing the residual layer from being formed in a non-patterned part.

The UV absorber which is used in the present invention is the same as that described above.

The solvent which is used in the present invention is selected depending on solubility and coating properties thereof. More specifically, the solvent may include propyleneglycolmonoethyletheracetate, ethoxyethylpropionate, butylacetic acid, etyleneglycolmonomethyletheracetate, propyleneglycolmonomethylether, propyleneglycolmethyletheracetate, diethyleneglycoldimethylether, diethyleneglycolmethylethylether, cyclohexanone, 3-methoxyethylpropionate or 3-ethoxymethylpropionate, particularly propyleneglycolmonoethyletheracetate, ethoxyethyl propionate or butylacetic acid.

The content of the solvent may vary depending on viscosity or total solids content of the composition. The remaining portion of the solvent may be included in the photosensitive resin composition, excluding the solids contents therefrom. Preferably, 40 wt % to 80 wt % propyleneglycolmonoethyletheracetate, 15 wt % to 40 wt % ethoxyethylpropionate and 1 wt % to 20 wt % butylacetic acid may be included with respect to the total amount of solvent used. If the content of the solvent ranges as described above, thickness differences may be overcome and the uniformity of the photosensitive resin composition may improve.

The photosensitive resin composition according to the present invention includes the foregoing components, and may further include cross-linkable acrylic monomer which has at least two double bonds, as necessary. The cross-linkable acrylic monomer may include bisphenol A diacrylate added with ethylene oxide, bisphenol A dimethaacrylate added with ethylene oxide, bisphenol A diacrylate added with propylene oxide, bisphenol A dimethaacrylate added with propylene oxide, diacrylate added with ethylene oxide, dimethacrylate added with ethylene oxide, diacrylate added with propylene oxide or dimethacrylate added with propylene oxide. Preferably, the acrylate cross-linkable monomer may be included from 3 wt % to 15 wt % in the photosensitive resin composition according to the present invention. If the content of the acrylate cross-linkable monomer ranges as described above, flexibility and stability of the photosensitive resin composition improve.

The photosensitive resin composition according to the present invention may further include additives such as a surfactant, sensitizer, hardener, pigment, etc. as necessary. Particularly, the surfactant may include a silicon surfactant or fluorosurfactant.

Preferably, the additives are included maximum 2 wt %, respectively, in the photosensitive resin composition. If the content of the additives exceeds 2 wt %, the residual layer may be formed, stability is lowered, and ion and impurities flow out to liquid crystals.

The present invention provides a method of forming a color filter by using the photosensitive resin composition, a color filter formed by the foregoing method and a CMOS image sensor employing the color filter. The photosensitive resin composition is used to form an over coating layer of the color filter. Other known color filter manufacturing methods may apply to prior and subsequent processes. More specifically, a substrate is coated with the photosensitive resin composition and then dried. Then, the substrate having the photosensitive resin layer is exposed to light, particularly ultraviolet rays by using a proper mask or template to form a desired pattern thereon. The exposed substrate is developed by alkali developing solution, cleansed with deionized water for 30 to 90 seconds to remove unnecessary parts. Then, the substrate is dried to form the pattern, and heated for 30 to 90 seconds at 150° C. to 250° C. by a heating device such as an oven, thereby forming the final pattern.

The photosensitive resin composition according to the present invention adjusts line width and height of a pattern without difficulty, forms a linear pattern, provides uniformity in size and height of fine patterns, provides good transmittance and is adequate to form an over coating layer of a color filter.

Hereinafter, exemplary embodiments of the present invention will be described to help understand the present invention. The exemplary embodiments exemplify the present invention, and the scope of the present invention is not limited to the exemplary embodiments.

Exemplary Embodiment 1

Thirty-three grams methacrylic acid, 40 g benzilmethacrylate, 11 g ethyltriglycol methacrylate and 16 g 2-hydroxyethylmethacrylate are polymerized in a solvent, i.e. 50 g propyleneglycol monoethylether to obtain acrylate polymer resin having a weight average molecular weight of 20,000 and a glass transition point of 102° C. Thirty grams acrylate resin, 5 g photopolymer resin represented by the chemical formula 5, 5 g cross-linkable monomer having at least two ethylene double bonds, 1 g UV absorber represented by the chemical formula 1, 1 g UV absorber represented by the chemical formula 2, 0.5 g Irgacure 907 (benzophenone initiator, manufactured by Ciba Special Chemicals) and 0.2 g 4,4-bisdiehtylaminobenzophenone as the photopolymerization initiator, 38 g propyleneglycolmethyletheracetate, 18 g 3-ethoxyethylpropionate and 6.3 g butylacetic acid as the solvent are mixed to manufacture liquid photosensitive resin composition.

Exemplary Embodiments 2 to 4 and Comparative Embodiments 1 to 3

With the same method as that in the exemplary embodiment 1, liquid photosensitive resin composition according to exemplary embodiments 2 to 4 and comparative embodiments 1 to 3 is manufactured. Here, the composition ratios of the components in Table 1 are various. The unit in the Table 1 is gram (g).

TABLE 1

|  | Exem. Embo. 1 | Exem. Embo. 2 | Exem. Embo. 3 | Exem. Embo. 4 | Com. Embo. 1 | Com. Embo. 2 | Com. Embo. 3 |
|---|---|---|---|---|---|---|---|
| Alkali soluble acrylate resin | 30 | — | 15 | 15 | 30 | 15 | 15 |
| Photopolymer resin in chemical formula 5 | 5 | 15 |  | 15 | — | 15 | 15 |

TABLE 1-continued

|  |  | Exem. Embo. 1 | Exem. Embo. 2 | Exem. Embo. 3 | Exem. Embo. 4 | Com. Embo. 1 | Com. Embo. 2 | Com. Embo. 3 |
|---|---|---|---|---|---|---|---|---|
| Photopolymer resin in chemical formula 6 | | | 30 | | 15 | | | |
| UV absorber in chemical formula 1 | | 1 | | 0.5 | | — | 7 | — |
| UV absorber in chemical formula 2 | | 1 | | 0.5 | 1 | — | — | 7 |
| UV absorber in chemical formula 3 | | | 1 | 0.5 | 1 | | | |
| UV absorber in chemical formula 4 | | | 1 | 0.5 | | | | |
| Cross-linkable monomer having two double bonds | | 5 | 5 | 3 | 5 | 5 | 5 | 5 |
| Photopolymerization initiator | Irgacure 907 | 0.5 | 0.5 | 0.5 | 0.5 | 0.5 | 0.5 | 0.5 |
| | 4,4-bisdiethyl aminobenzo phenone | 0.2 | 0.2 | 0.2 | 0.2 | 0.2 | 0.2 | 0.2 |
| Solvent | Propylene glycolmethyl etheracetate | 38 | 38 | 38.5 | 38 | 39 | 36 | 36 |
| | Ethoxyethyl propionate | 18 | 18 | 19.5 | 18 | 19 | 15 | 15 |
| | Butylacetic acid | 6.3 | 6.3 | 6.3 | 6.3 | 6.3 | 6.3 | 6.3 |

Development properties, line width of a pattern, linear pattern and transmittance are evaluated by using the photosensitive resin composition according to the exemplary embodiments 1 to 4 and comparative embodiments 1 to 3.

A) Evaluation of Development Properties

The photosensitive resin composition which is manufactured according to the exemplary embodiments 1 to 4 and comparative embodiments 1 to 3 is spin-coated to form a layer having 1□ thickness. Then, the photosensitive resin composition is dried for two minutes on a hot plate at 90° C. to form the coating layer. Color filter resist (DCR-720B, manufactured by Donjin Semichem) is applied to the coating layer. The coating layer is dried for two minutes on a hot plate at 90° C. A photo mask is provided on the coating layer to be exposed by super high pressure mercury having wavelengths of 200 nm to 400 nm to reach approximately 200 mJ/cm$^2$ for some time, based on 365 nm wavelengths. The coating layer is developed by KOH developer (DCD-260CF, manufactured by Dongjin Semichem) through a spray nozzle for some time. The developability is evaluated according to the pattern image and adhesiveness of developed fine pattern. The evaluation result is provided in Table 2 below.

TABLE 2

| | | Exemplary embodiments | | | | Comparative embodiments | | |
|---|---|---|---|---|---|---|---|---|
| Items | | 1 | 2 | 3 | 4 | 1 | 2 | 3 |
| Mask size | 50□ | ○ | ○ | ○ | ○ | □ | ○ | ○ |
| | 20□ | ○ | ○ | ○ | ○ | □ | □ | □ |
| | 10□ | ○ | ○ | ○ | ○ | □ | X | X |

Ref.
○: good pattern image 100%
□: fair pattern image 90%
X: bad pattern image 80%

As shown in Table 2, the photosensitive resin composition according to the exemplary embodiments 1 to 4 of the present invention provides a good pattern image and adhesiveness with the mask sizes of 50 μm, 20 μm and 10 μm, and is better than those according to the comparative embodiments 1 to 3.

B) Pattern Profile

The pattern profile of the photosensitive resin composition according to the exemplary embodiments 1 to 4 is compared with that according to the comparative embodiments 1 to 3. The comparison result is illustrated in FIGS. 2 to 8. As shown therein, the photosensitive resin composition according to the exemplary embodiments of the present invention provides better line width of a pattern and forms a more uniform and linear pattern, compared to the photosensitive resin composition according to the comparative embodiments.

C) Transmittance

Figure 9:
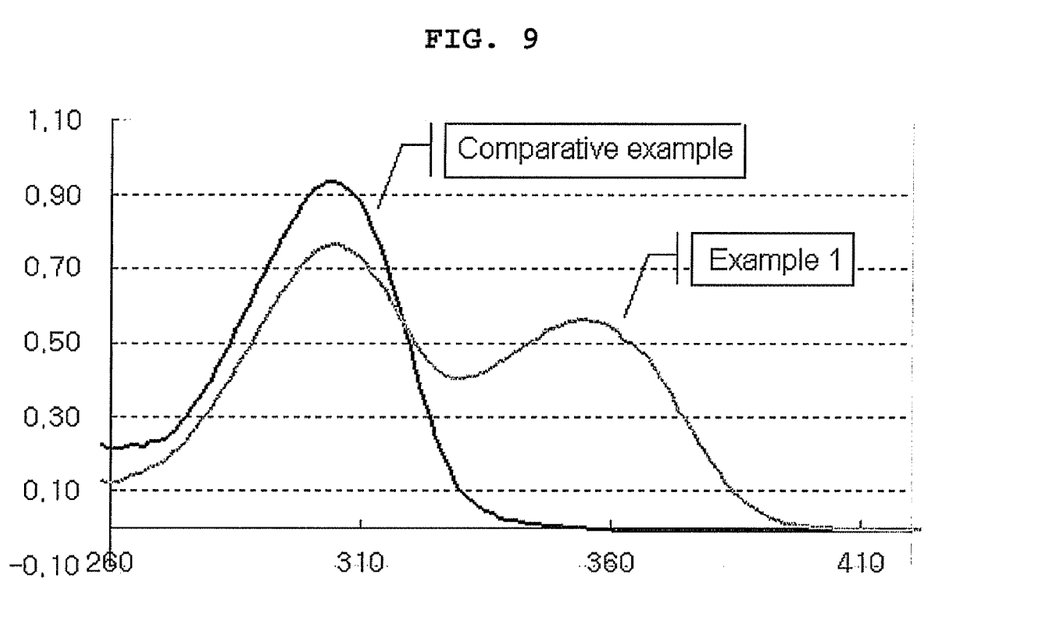
FIG. 9 is a graph which illustrates transmittance of the photosensitive resin composition according to the exemplary embodiments and the comparative embodiments of the present invention.

The photo resists are diluted into liquids and transmittance thereof is estimated by a UV estimator (Lambda 850 manufactured by PerkinElmer) according to the Beer-Lambert Law. As shown in FIG. 9, the photosensitive resin composition according to the exemplary embodiments provides absorbance of 365 nm wavelength of ultraviolet rays, compared to that according to the comparative embodiments, thereby extending the pattern due to diffused reflection and forming the linear pattern while lowering the sensitivity.

EFFECT OF INVENTION

A photosensitive resin composition according to the present invention adjusts line width and height of a pattern without difficulty, forms a more linear pattern, provides good transmittance and is adequate to form an over coating layer of a color filter.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A photosensitive resin composition which is used to form an over coating layer of a color filter, the photosensitive resin composition, comprising:

a) 5 wt % to 50 wt % photo polymer resin comprising a compound which is represented by a following chemical formula 5 or 6:

[Chemical Formula 5]

[Chemical Formula 6]

wherein each $R_1$ refers to an alkyl group having 1 to 2 hydrogen atoms or carbon atoms, $R_2$ is an alkyl group having 2 to 5 carbon atoms that is substituted with a hydroxyl group or not, and a+b+c=1, 0.1<a<0.5, 0<b<0.5 and 0.1<c<0.5;

b) 5 wt % to 30 wt % cross-linkable monomer;

c) 0.5 wt % to 5 wt % photopolymerization initiator;

d) 0.1 wt % to 5 wt % UV absorber; and e) a solvent for the remaining portion.

2. The photosensitive resin composition according to claim 1, wherein the UV absorber comprises a compound which is represented by a following formula 1, 2, 3 or 4:

[Chemical Formula 1]

[Chemical Formula 2]

[Chemical Formula 3]

[Chemical Formula 4]

wherein each of $R_1$ to $R_5$ in the chemical formulas 1 to 4 refers to hydrogen or $CH_3$.

3. The photosensitive resin composition according to claim 1, further comprising 5 wt % to 30 wt % alkali soluble acrylate resin having a glass transition temperature of 150° C. or below.

4. The photosensitive resin composition according to claim 3, wherein the alkali soluble acrylate resin is manufactured by polymerizing 20 wt % to 50 wt % unsaturated carboxylic acid, 15 wt % to 45 wt % aromatic monomer, 3 wt % to 15 wt % monomer to lower the glass transition temperature, and 10 wt % to 30 wt % acrylic monomer.

5. The photosensitive resin composition according to claim 1, wherein the cross-linkable monomer comprises a compound selected from the group consisting of 1,4-butanedioldiacrylate, 1,3-butyleneglycoldiacrylate, ethyleneglycoldiacrylate, pentaerythritoltetraacrylate, triethyleneglycoldiarcrylate, polyethyleneglycoldiacrylate, dipentaerythritoldiarcrylate, sorbitoltriacrylate, trimethylpropanetriacrylate, dipentaerythritolpolyacrylate, and methacrylate thereof.

6. The photosensitive resin composition according to claim 1, wherein the solvent comprises 40 wt % to 80 wt % propyleneglycolmonoethyletheracetate, 15 wt % to 40 wt % ethoxyethyl propionate and 1 wt % to 20 wt % butylacetic acid based on the total amount of the solvent used.

7. The photosensitive resin composition according to claim 1, further comprising surfactant, sensitizer, hardener or pigment.

8. A color filter forming method, comprising the steps of;
   forming a resin layer by coating a substrate with the photosensitive resin composition according to claim 1 and drying the substrate;
   exposing the substrate having the resin layer to ultraviolet rays using a proper mask or template to form a desired pattern thereon;
   developing the exposed substrate by alkali developing solution, and cleaning with deionized water for 30 to 90 seconds to remove unnecessary parts; and
   drying the substrate and heating the substrate for 30 to 90 seconds at 150° C. to 250° C. to form a final pattern.

9. A color filter which is formed by the color filter forming method according to claim 8.

* * * * *